United States Patent
Pihan et al.

(10) Patent No.: US 9,303,929 B2
(45) Date of Patent: Apr. 5, 2016

(54) HEAT EXCHANGER FOR A SYSTEM FOR SOLIDIFICATION AND/OR CRYSTALLIZATION OF A SEMICONDUCTOR MATERIAL

(75) Inventors: Etienne Pihan, La Motte Servolex (FR); Denis Camel, Chambery (FR); Nicolas Coudurier, Brison-Saint-Innocent (FR)

(73) Assignee: Commissariat a L'energie Atomique et aux Energies Alternatives, Paris (FR)

( * ) Notice: Subject to any disclaimer, the term of this patent is extended or adjusted under 35 U.S.C. 154(b) by 325 days.

(21) Appl. No.: 13/988,438

(22) PCT Filed: Nov. 29, 2011

(86) PCT No.: PCT/EP2011/071290
§ 371 (c)(1),
(2), (4) Date: May 20, 2013

(87) PCT Pub. No.: WO2012/072633
PCT Pub. Date: Jun. 7, 2012

(65) Prior Publication Data
US 2013/0239370 A1    Sep. 19, 2013

(30) Foreign Application Priority Data
Nov. 29, 2010    (FR) .................................... 10 59867

(51) Int. Cl.
*F28F 13/00* (2006.01)
*C30B 11/00* (2006.01)
*C30B 29/06* (2006.01)
*F28F 3/04* (2006.01)

(52) U.S. Cl.
CPC ............... *F28F 13/00* (2013.01); *C30B 11/003* (2013.01); *C30B 29/06* (2013.01); *F28F 3/04* (2013.01)

(58) Field of Classification Search
CPC ...... C30B 11/00; C30B 29/06; H01L 23/367; F28F 3/04
See application file for complete search history.

(56) References Cited

U.S. PATENT DOCUMENTS

| 4,770,242 A | * | 9/1988 | Daikoku et al. | ............... 165/185 |
| 5,787,976 A | * | 8/1998 | Hamburgen et al. | ......... 165/185 |
| 6,138,748 A | | 10/2000 | Hamburgen et al. | |

(Continued)

FOREIGN PATENT DOCUMENTS

| DE | 3323896 A | 1/1985 |
| DE | 10 2005 014051 A | 10/2005 |
| DE | 10 2008 029951 A | 12/2009 |
| EP | 0 169 270 A | 1/1986 |
| EP | 2 014 803 A | 1/2009 |

(Continued)

OTHER PUBLICATIONS

Office action from Kazakhstan Patent Office issued for corresponding Kazakhstan application 2013/1581.1 dated Nov. 10, 2014, English translation.

(Continued)

*Primary Examiner* — Colleen Dunn
(74) *Attorney, Agent, or Firm* — Frommer Lawrence & Haug LLP (57) ABSTRACT

Heat exchanger (1) for a system for solidification and/or for crystallization of a semiconductor material, comprising a first member (2) and a second member (3), the first and second members being movable with respect to each other, characterized in that the first member comprises a first pattern of relief (21) and the second member comprises a second pattern of relief (31), the first pattern of relief being designed to cooperate with the second pattern of relief.

21 Claims, 9 Drawing Sheets

(56) References Cited

U.S. PATENT DOCUMENTS

| | | |
|---|---|---|
| 6,604,575 B1 | 8/2003 | Degtiarenko |
| 2,014,803 A1 | 5/2012 | Servant et al. |
| 2006/0021747 A1 | 2/2006 | Schultz |
| 2006/0060328 A1 | 3/2006 | Ewes et al. |
| 2006/0087816 A1 | 4/2006 | Ewes et al. |
| 2007/0030656 A1* | 2/2007 | Ross et al. .................. 361/710 |
| 2008/0028987 A1* | 2/2008 | Duda ...................... 106/287.26 |
| 2009/0013925 A1* | 1/2009 | Servant et al. ............... 117/206 |
| 2011/0259262 A1 | 10/2011 | Khattak et al. |

FOREIGN PATENT DOCUMENTS

| | | |
|---|---|---|
| GB | 2279585 A | 1/1995 |
| JP | 2006-93700 A | 4/2000 |
| WO | WO 2010/005705 A | 1/2010 |

OTHER PUBLICATIONS

Notice of Reasons for Rejection from Japanese Patent Office for corresponding Japanese application 2013-540415 mailed Jun. 23, 2015, English translation.

* cited by examiner

HEAT EXCHANGER FOR A SYSTEM FOR SOLIDIFICATION AND/OR CRYSTALLIZATION OF A SEMICONDUCTOR MATERIAL

This application is a 371 of PCT/EP2011/071290 filed on Nov. 29, 2011, published on Jun. 7, 2012 under publication number WO 2012/072633, which claims priority benefits from French Patent Application Number 10/59867 filed Nov. 29, 2010, the disclosure of which is incorporated herein by reference.

The present invention relates to the technical field of directional solidification of semiconductors in a crucible or a mould with an extraction of heat via the bottom of the crucible or mould. Preferably, it relates to materials having a latent heat greater than $10^9$ J/m$^3$ and/or a thermal conductivity lower than 50 W/m·°C. in its solid phase and/or a material/crucible pair having a thermal resistance greater than 0.01° C.·m$^2$/W. It relates in particular to an exchanger allowing a material contained in a crucible or a mould to be cooled, notably a semiconductor material for a photovoltaic application. It also relates to a process for solidification and/or for crystallization of a semiconductor material using such an exchanger.

Figure 1:
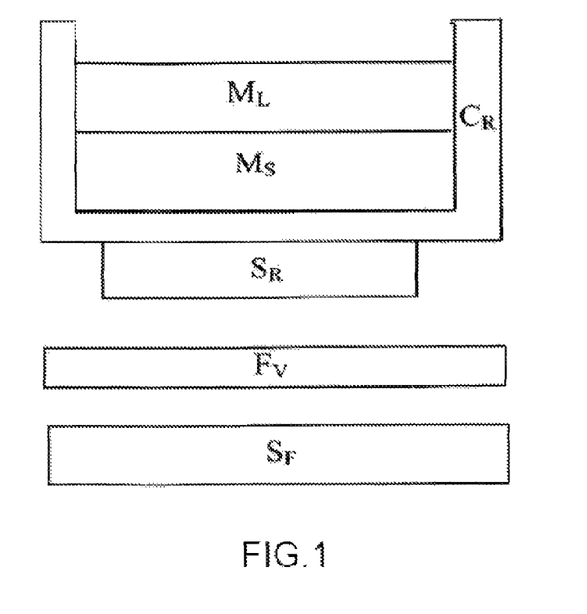
FIG. 1 is a diagram of an exchanger known from the prior art.

In the processes of directed solidification in a crucible of material with a high melting point (>1000° C.), for example in the processes of growth of polycrystalline ingots of photovoltaic silicon, the directed solidification is generated by a controlled cooling of the bottom of the crucible. As shown in FIG. 1, in the prior art, the heat flux is extracted by radiation from an assembly placed under the crucible (often an assembly supporting the crucible). More precisely, the material in liquid $M_L$ and solid $M_S$ phases, being partially solidified in a directional manner, is contained in the crucible Cr having an opening at the top. The crucible is placed on a hot assembly $S_R$ potentially used as a mechanical support for it. The hot assembly transmits the heat flux extracted from the material to a cold assembly $S_F$ via a device allowing the exchange of heat between the two hot and cold assemblies to be controlled. The control of the thermal exchange takes place for example by radiation via an element $F_v$ determining the radiation (via a viewing factor). In a complementary manner, the control of the thermal exchange may also take place for example via heat conduction between the hot and cold assemblies.

The high limit value of the extracted heat flux is determined by the thermal exchange principle, by the areas of the surfaces of the hot assembly $S_R$ and of the cold assembly $S_F$, by the viewing factor between the hot assembly $S_R$ and the cold assembly $S_F$, by the properties of the materials used (thermal conductivity, emissivity) and by the temperatures of the assemblies, which temperatures are not independent of the heat fluxes extracted. The heat flux extracted from the material (liquid and solid phases $M_L$ and $M_S$) is in any case less than the heat flux extracted by the assembly under the crucible.

The low limit value of the extracted heat flux is determined either by an insulation whose means of implementation are dependent on the physical principle used for the extraction (screen for radiation, placing out of contact for conduction), or by an introduction of heat by heating of the hot assembly. In this latter case, the heat flux is still extracted from the hot assembly but it is possible to eliminate or to significantly minimize the heat flux between the crucible $C_R$ and the hot assembly and hence to eliminate or to significantly minimize the heat flux coming out of the material.

The most effective implementation for the extractions of heat consists in having:
- the low limit as low as possible,
- the high limit as high as possible, and
- adjustment ranges as continuous as possible between these two limits by using a feasible means that is controllable in a predictable and reproducible manner, in the ideal case without additional consumables.

In other words, an extraction of heat (or heat flux coming from the material) is sought that may be modulated by varying the heat flux over an achievable range, this potentially involving the use of crucibles or of particular materials in order to reach the limits of the range.

All the known industrial or laboratory systems that are used in the field of directed solidification of silicon for photovoltaic applications have in common that they allow a regulation of the flux of heat extracted through a device disposed under the crucible, either:
- principally by radiation:
  in this case, the regulation takes place via:
  - movement of a screen (for example on a device DSS450HP marketed by the company GT Solar International, Inc.) defining a viewing factor between a radiating surface of the hot assembly and a surface of the cold assembly,
  - movement of a radiating surface of the hot assembly (for example on a device Heat Exchanger Method marketed by the company Crystal Systems, Inc.) with respect to a surface of the cold assembly, the radiation taking place for example through a screen,
  - control of the temperature of the hot assembly under the crucible by heating (for example on a device SCU400 plus or SCU800 plus marketed by the company ALD Vacuum Technologies GmbH) for an extraction system fixed at the condition of extraction at the high limit, in other words a non-modulatable extraction regulated by a flux of heat supplied under the crucible so as to extract less heat from the material.
- principally by conduction:
  in this case, the regulation takes place via:
  - control of the temperature of the cold assembly under the crucible by injection of a relatively colder fluid into the latter (for example on a device Helium Cooled Heat Exchanger Method marketed by the company Crystal Systems, Inc.)
  - movement bringing the hot assembly and the cold assembly into contact via a controllable thermal resistance.

In the first type of device, the variation of the heat flux is obtained by variation of the surface area for exchange by radiation and the maximum heat flux is limited by the maximum exchange surface area which is at the most close to the surface area of the horizontal cross section of the hot assembly.

In the second type of device, the variation of the heat flux exchanged by conduction/convection is obtained in one case by variation of the flow of a fluid, and, in the other case, by variation of the thickness of gas separating two conducting plates. The maximum heat flux is then limited either by the maximum flow, the conductivity and the heat capacity of the fluid, or by the thermal resistance between the two plates brought into contact, the latter resulting from the unavoidable defects in planarity of the two opposing surfaces.

The existing systems do not allow a high enough maximum heat flux to be obtained at low temperature while at the same time providing a good insulation at high temperature. The problem is to be able to maintain a high extraction of heat under the crucible when the height of material to be solidified is significant or when the crucible is a good thermal insulator. In other words, the problem consists in increasing the flux of heat that can be extracted from the material to be solidified while the temperature of the material is relatively low. For example, in the case of ingots of polycrystalline silicon with a height of 20 to 45 cm with a silica crucible of 20 mm, the heat flux extracted by a single surface radiating in the range 800-1000° C. is limited. This limits the thermal gradient and the speed of solidification.

One solution to the problem may be imagined whereby the radiating surface area of the crucible support is increased by simply increasing the dimensions of the latter:

The radiating surface of the lateral faces of the crucible support may be increased as long as the cold surface is adapted. This has the flaw of localizing the extraction of heat on the sides and of introducing a non-uniformity. This technique also has the flaw of adding a thermal resistance by conduction due to the thickness thus increased of the crucible support.

The width and thus the radiating surface area in the bottom of the crucible support may be increased. However, the exchanger block cannot be much wider than the crucible and hence than the ingot without being detrimental to the uniformity of the extraction of heat. The factor for increase in heat flux via the increased surface area therefore remains limited in this option.

In the existing systems, the distribution of the heat flux on the lower face of the crucible is imposed by the chosen method for increasing the heat flux, and is therefore directly linked to the chosen value of heat flux. However, this parameter plays a specific role in each of the steps of the process (germination, crystallization, cooling of the solid), such that it would be advantageous to be able to modify this distribution from one step of the process to the next.

The aim of the invention is to provide an exchanger allowing the aforementioned problems to be overcome and improving the exchangers known from the prior art. In particular, the invention provides an exchanger allowing a simple and precise modulation and/or control of the heat flux extracted from a crucible or from a mould, notably for an application to solidification and/or to crystallization of a semiconductor material used in the field of photovoltaic energy. Furthermore, the invention provides a solidification and/or crystallization process using such an exchanger.

According to the invention, the heat exchanger, notably a heat exchanger for a solidification and/or crystallization system for a semiconductor material, comprises a first member and a second member, the first and second members being movable with respect to each other. The first member comprises a first pattern of relief and the second member comprises a second pattern of relief, the first pattern of relief being designed to cooperate with the second pattern of relief.

The exchanger can comprise an element for displacement of the first member relative to the second member allowing an exchanged heat flux to be controlled or regulated, notably a heat flux exchanged between the first member and the second member.

The displacement element can comprise a regulator for modulating the distance between the first member and the second member according to the desired exchanged heat flux, in other words according to the heat flux that it is sought to pass through the exchanger, or to be extracted from a solidification and/or crystallization mould or crucible.

The regulator allows the first and second members to be positioned at least two different distances in order to obtain at least two different exchanged heat fluxes or at least two different exchange coefficients of the exchanger or two different exchange coefficients.

The regulator allows the distance between the two members to be continuously varied between a first position where an exchange surface area is a minimum and a second position where the exchange surface area is a maximum.

The first pattern of relief can comprise recesses and protrusions and the second pattern of relief can comprise recesses and protrusions.

The pitch of the protrusions and of the recesses can be variable along one dimension of the first member and of the second member.

The height of the protrusions can be variable along one dimension of at least one of the first and second members.

The first and second patterns of relief can cooperate by nesting of protrusions into recesses.

The first pattern of relief can have protrusions with inclined sides parallel to inclined sides of recesses of the second pattern of relief.

The first and second patterns of relief can have parallelepipedic structures, notably structures disposed along the same longitudinal axis.

The protrusions of the first pattern of relief can be covered with a first material exhibiting thermal characteristics that are different from the material composing the rest of the first member, notably exhibiting thermally insulating characteristics.

The protrusions of the second pattern of relief can be covered with a second material exhibiting thermal characteristics that are different from the material composing the rest of the second member, notably exhibiting thermally insulating characteristics.

The materials of the first and second members can exhibit different thermal characteristics.

The first member can be designed to be thermally linked to a crucible or to a mould and the second member can be designed to be thermally linked to a cold source.

The exchanger can comprise a first element for including a modulatable thickness of gas between the crucible and the first member and/or can comprise a second element for including a modulatable thickness of gas between the cold source and the second member.

At least one of the protrusions of the first and/or of the second members can be dimensioned so as to come into contact with the bottom of the recesses of the second and/or of the first members in a particular relative position of the first and second members.

According to the invention, a system for solidification and/or for crystallization of a semiconductor material comprises an exchanger as previously defined.

According to the invention, a process for solidification and/or for crystallization of a semiconductor material uses an exchanger as previously defined and comprises:
  a step for positioning the first member relative to the second member, and
  a step for heat transfer from the crucible to the cold source, via the first and second members of the exchanger.

The positioning step can be carried out during the heat transfer step.

The exchange coefficient of the exchanger can be varied between the beginning and the end of the solidification and/or crystallization. For this purpose, the relative position of the two members can be varied during the solidification and/or the crystallization.

The appended drawings show, by way of examples, various embodiments of an exchanger according to the invention.

Figure 2:
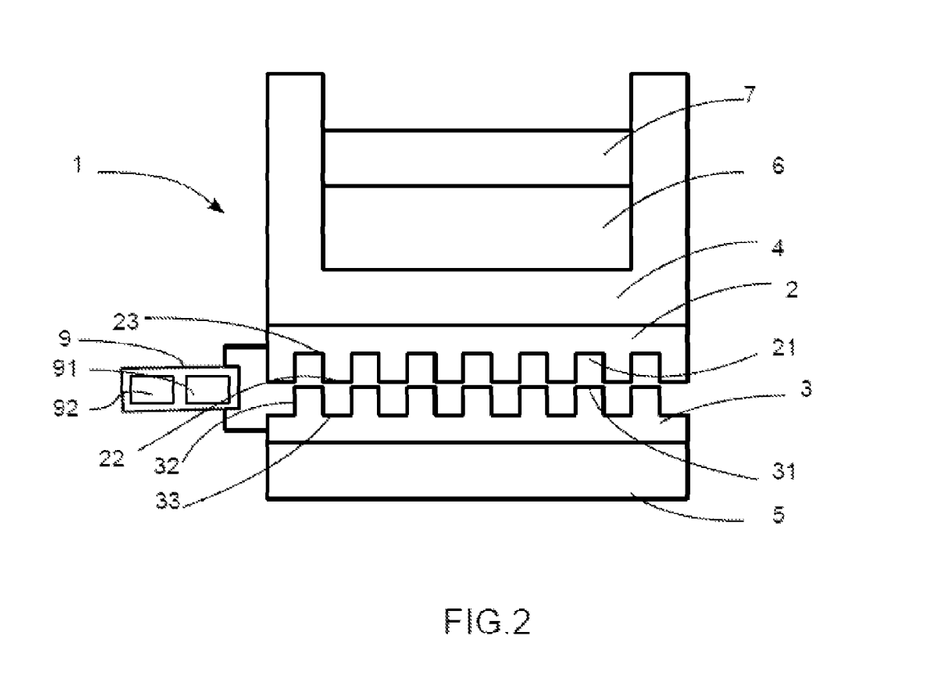
FIG. 2 is a diagram of a first embodiment of an exchanger according to the invention.

A first embodiment of a heat exchanger 1 shown in FIG. 2 is described hereinafter. It equips for example a system for solidification and/or for crystallization of a semiconductor material, notably of a photovoltaic semiconductor material. The solidification and/or crystallization system for example forms part of an oven.

The solidification and/or crystallization system comprises a crucible 4 (or mould) designed to contain the material 6, 7 to be solidified and/or crystallized, a cold source 5 designed to cool the crucible and an exchanger 1 designed to regulate the heat flux transferred from the crucible to the cold source. The material can exhibit a liquid phase 7 and a solid phase 6.

The exchanger comprises a first member 2 and a second member 3. The exchanger also comprises a means or element for moving the first member relative to the second member.

The first member comprises a first pattern of relief 21 and the second member comprises a second pattern of relief 31. The first pattern of relief is designed to cooperate with the second pattern of relief. Preferably, the first and second patterns of relief cooperate by nesting. For example, the first and second patterns of relief can be complementary.

In a first relative position of the first and second members, the exchanger exhibits a first exchange coefficient and, in a second relative position of the first and second members, the exchanger exhibits a second exchange coefficient, different from the first exchange coefficient. Indeed, between the two relative positions, the areas of the opposing surfaces of the first and second members are different, from which it follows that the exchange coefficient is different. In particular, the areas of the opposing surfaces of the first and second members are different because the areas of the opposing lateral surfaces of the protrusions are different.

The displacement element 9 allows the first and second members to be moved, notably in translation, with respect to each other. This element comprises an actuator 91.

The exchanger according to the invention allows the flux of heat extracted from the crucible or from the mould to be controlled.

As previously seen, the element for moving the first member relative to the second member allows the exchanged heat flux, notably a flux of heat exchanged between the first member and the second member to be controlled or regulated, in particular by adjusting the heat transfer coefficient of the exchanger.

Preferably, the displacement element comprises a regulator 92 allowing the distance between the first member and the second member to be modulated according to the desired exchanged heat flux, in other words according to the flux of heat that it is sought to pass through the exchanger, or to be extracted from a solidification and/or crystallization mould or crucible. Preferably, the regulator controls or drives the actuator which positions the first and second members with respect to each other. Depending on an desired exchanged heat flux through the exchanger or depending on a desired exchange coefficient, the regulator determines a control command and delivers this command to the actuator. By executing this command, the actuator positions the first and second members in an appropriate manner in order to reach the desired exchanged heat flux through the exchanger or the desired exchange coefficient.

The regulator can comprise regulation elements allowing an open-loop regulation or a closed-loop regulation to be implemented.

The regulator allows the distance between the two members to be continuously varied between a first position, where an exchange surface area is a minimum, and a second position where the exchange surface area is a maximum.

The exchanger allows the range of high value of heat flux, that it is possible to extract from the material via the crucible or the mould, to be broadened beyond the limits of the current systems. By broadening this range, it is possible to increase the material yields and the productivity via the height of solidified ingots and/or the speeds of solidification. It is also possible to enhance certain quality criteria by choosing, for identical speed and height of crystallization, to increase the thermal gradient within the material and thus to control the ratio speed of crystallization/thermal gradient at the solid-liquid interface over a more extended range.

In particular, the heat exchanger according to the invention allows the heat to be extracted from a material to be solidified, in particular the heat from the material during its crystallization into an ingot at high temperature. The heat exchanger allows:

- the exchange coefficient of the exchanger to be varied between the beginning and the end of crystallization (for example, for silicon, between 1400° C. and 600° C. for the temperature of the first member). At high temperature, the radiation naturally generates high heat fluxes: the exchanger is then set in a position such that the exchange coefficient is low (for example less than 30 W·m$^{-2.°}$ C.$^{-1}$) by moving the first and second members apart. Conversely, at low temperature, the radiation generates very low heat fluxes. The exchanger is set in a position such that the exchange coefficient is high (for example greater than 60 W·m$^{-2.°}$ C.$^{-1}$) by bringing the first and second members closer together. Thus, the heat flux extracted can be maintained as constant as possible.
- the spatial distribution of the exchange coefficient of the exchanger to be chosen.

For this purpose:

- the exchanger comprises a first member (hot member) with a thermal connection to the crucible or the mould, and a second member (cold member) with a thermal connection to a cold source such as a water tank,
- complementary fingerprints or patterns of relief, notably with complex shapes, are formed in the opposing faces of the first and second members. The geometry of these fingerprints can be characterized by their developed surfaces and/or their spatial distribution and/or their depth,
- a relative movement of the first and second members allows the exchange surface area between the two members to be continuously varied, between an insulating position, where the exchange surface area is a minimum (widely spaced members), and a conducting position where this surface area is a maximum (members nested into each other),
- optionally, each of the first and second members is composed of two types of materials allowing the insulating and conducting functions to be satisfied. This hybridization allows all the properties of the exchanger listed hereinabove to be reinforced,
- optionally, the second member may be separated from the cold source so as to reinforce the insulating function or the first member may be separated from the crucible so as to reinforce the insulating function.

Figure 3:
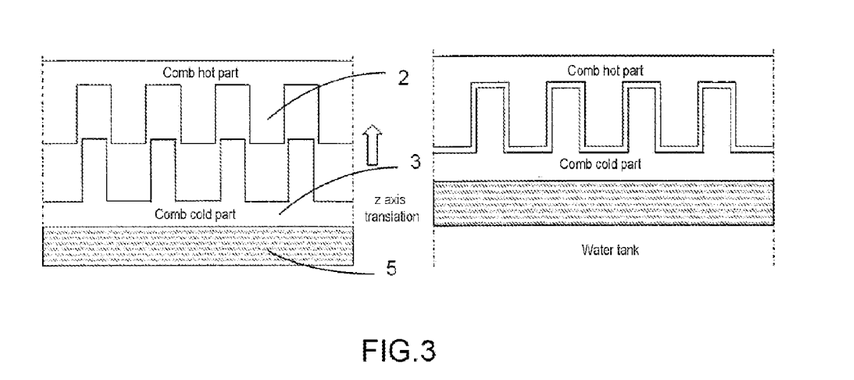
FIG. 3 is a diagram showing a detail of the first embodiment of an exchanger according to the invention, the exchanger being shown in two configurations.

The formation of the complementary fingerprints or patterns of relief in the two opposing faces of the first and second members and the relative displacement of the first and second members allow, as illustrated in FIG. 3, an exchange surface area to be formed that has a significantly larger area than the area of a horizontal straight section of one of the first and second members. The ratio between these areas can for example be from 1 to 10.

This design allows the heat flux exchanged by radiation to be varied up to values much larger than in the known devices. In addition, it allows a contribution for exchange by conduction/convection in the gas located between the first and second members to be added. This contribution is adjustable by the choice of the plays between the opposing faces of the first and second members. The range of heat fluxes accessible can be adjusted by the choice of the geometry, the maximum heat flux extracted by radiation depending on the maximum exchange surface area and the contribution of the exchange by conduction additionally depending on the thickness of the plays between the opposing surfaces of the first and second members and on the thermal conductivity of the gas between the first and second members. This range may also be adjusted by the choice of the nature of the materials for the first and second opposing members, so as to adapt their thermal conductivity and their emissivity, and also the choice of the nature of the gas filling the gap between these surfaces. The members may also consist of a combination of different materials. Thus, by a simple relative displacement of the two opposing members, a controlled increase is achieved, up to a factor that can exceed 10, in the heat flux extracted at a given temperature from the first member. The maximum heat flux can therefore be greater, by up to a factor 10, than that extracted under the normal conditions of exchange by radiation between members having plane faces. This factor may again be greatly increased by adopting conditions (gap and nature of the gas) for which the contribution of the exchange by conduction/convection through the film of gas remaining between the first and second members becomes significant.

Figure 4:
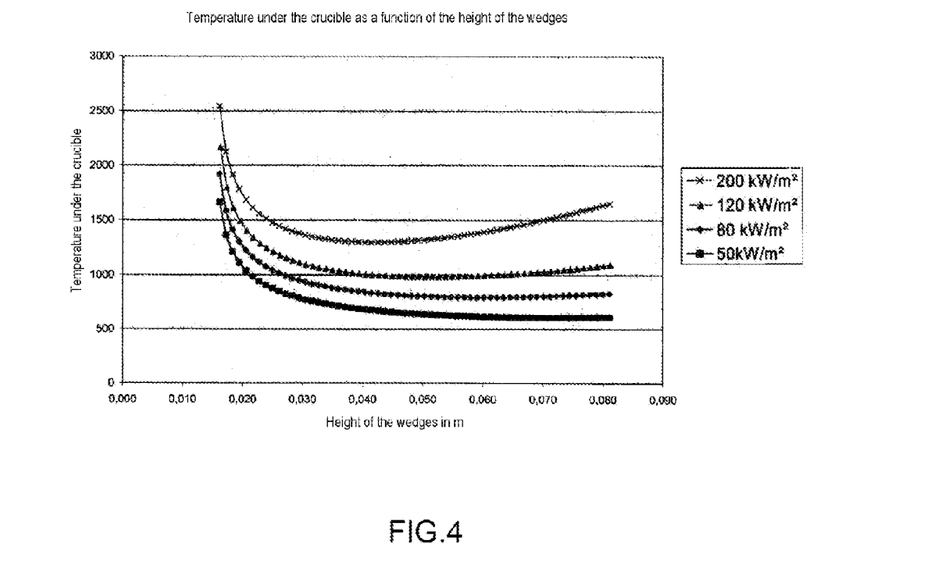
FIG. 4 is a graph illustrating the variations of the temperature under a crucible as a function of the height of the protrusions of the first and second members.
Figure 5:
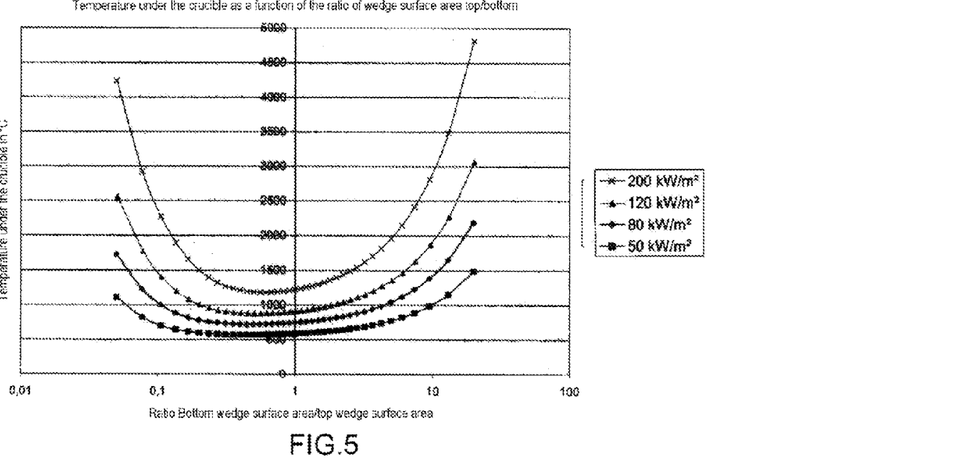
FIG. 5 is a graph illustrating the variations of the temperature under a crucible as a function of the ratio of the area of the surfaces of the straight sections of the protrusions of the second member over the area of the surfaces of the straight sections of the protrusions of the first member, for four given values of heat flux.

In order to reach the maximum heat fluxes targeted, the geometry of the fingerprint or relief should preferably satisfy precise criteria:

- if the protrusions (for example wedges) are too long, the thermal resistance is increased given the length of the material, and if the protrusions are too short, the area of the exchange surface area is hardly increased with respect to the area of the exchange surface area S0 between two plane members. As shown in FIG. 4, the optimum height of the protrusions varies as a function of the desired heat flux. The greater this heat flux, the lower the optimum height of the protrusions, because the losses in value due to the thermal resistance of the protrusions increase accordingly.
- another limit of this architecture is constituted by the ratio of the area of the horizontal surface of the conducting protrusions of the first member with respect to the area of the horizontal surface of the conducting protrusions of the second member. Each configuration (depending on the height of the protrusions, on the desired heat flux, etc.) has its optimum. However, a larger protruding surface area on the first member is preferable in order to allow the highest possible temperature to be obtained, with respect to the temperature of the protrusions of the second member, in order to facilitate an exchange by radiation, as illustrated in FIG. 5.

Depending on the minimum heat fluxes targeted in the insulating position, it may be useful to separate the second member from the cold source in order to create a thermal resistance between these two elements: the value of the minimum can thus be decreased (for example, so as to obtain a coefficient below 30 W·m$^{-2.°}$ C.$^{-1}$).

Figure 6:
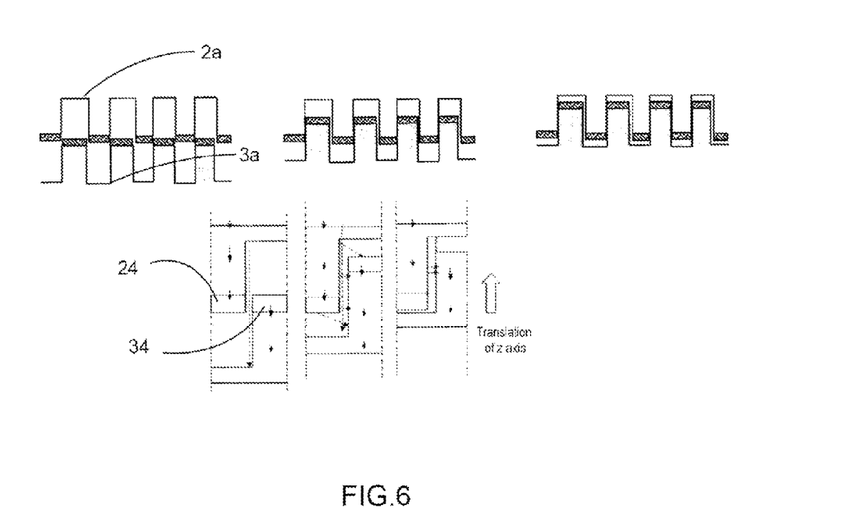
FIG. 6 is a diagram of a second embodiment of an exchanger according to the invention.

As shown in FIG. 6, in a second embodiment, the exchanger is such that it comprises first 2a and second 3a members having protrusions of a conducting material and whose ends are coated with an insulating material 24, 34. Thus, in the position where the insulators of the first member and of the second member are facing each other (shown by the upper left-hand diagram in FIG. 6), the first and second members are separated by a continuous, or substantially continuous, layer of insulating material.

The lateral conducting faces of the protrusions are brought face-to-face by a relative movement of the first and second members, as shown by the upper middle diagram in FIG. 6, and, to a greater extent, as shown by the upper right-hand diagram in FIG. 6.

The implementation of such a composite exchanger at high temperature presents technological difficulties.

The reason for this is that the thermal expansions and the mechanical plays may pose a problem during the movement of the first and second members with respect to each other, notably in translation. Moreover, contacts between the protrusions could occur, which could lead to violent phenomena of local heat transfers that can damage the exchanger. Lastly, it is not necessarily easy to deposit an insulating material onto the protrusions.

Furthermore, the exchanger according to the invention can allow the spatial distribution of the extracted heat flux, being transferred from the crucible 4 or mould to the cold source 5, to be varied according to needs. This may be obtained by the formation of a non-uniform pattern of relief along the surfaces of the first and second members, in other words by varying the width and height of the protrusions. This offers the possibility of implementing a wide variety of spatial distributions of the heat flux and, in addition, of varying this distribution as a function of the relative displacement of the first and second members, as is illustrated in the following embodiments.

The following experimental results have been obtained with an exchanger having a shape of revolution, comprising 7 protrusions with a height of 65 mm (15 mm of insulating material on top of 50 mm of conducting material). The thickness of the protrusions is 9 mm and the thickness of gas between the wedges is 1.5 mm. The gas contained in the oven is argon. The cold source 5 is a water tank made of copper of 160 mm in diameter. It uses water at a temperature of 28° C. for the cooling. The crucible 4 is made of quartz with a diameter of 160 mm and contained the equivalent of 5 kg of silicon. Thermocouples are situated under a plate, notably made of graphite, with a thickness of 3 mm situated under the crucible.

Figure 7:
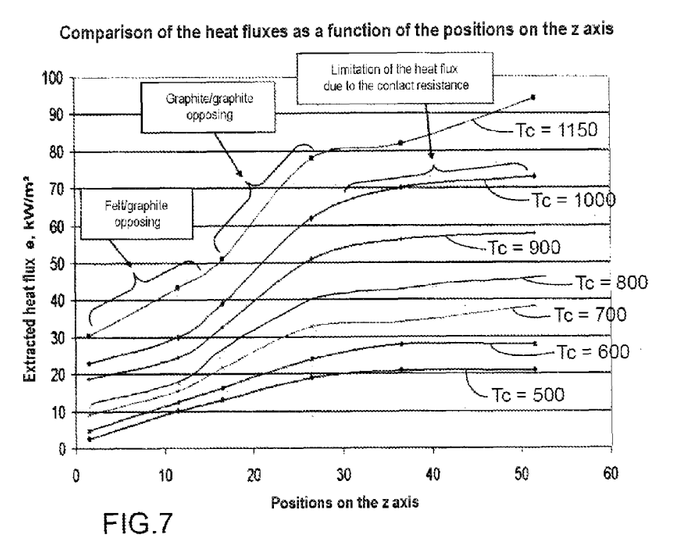
FIG. 7 is a graph illustrating the variations of the heat flux transferred via an exchanger according to the invention as a function of the relative positions of the first and second members, for seven given values of crucible temperature.

FIG. 7 shows the extracted heat flux as a function of the position of the cold source and hence of the relative position of the first and second members. The higher the position of the water tank, the more the first and second members are nested and the larger the opposing exchange surface area.

Three behaviors are observed on this graph:

z<15 mm: A first part where the insulating material at the ends of the protrusions are facing the conducting material protrusions. The heat flux increases proportionally with the displacement.

15 mm<z<32 mm: A second part where the conducting material of the various protrusions becomes opposing. The increase in the heat flux as a function of the displacement of the first member relative to the second member is then greater.

z>32 mm: A last part where the heat flux variation flattens off with respect to the displacement. This may be explained by the various contact resistances present at the interfaces (cold source/second member, first member/crucible plate) which limit the total heat flux that can be extracted from the crucible to the cold source. These contact resistances are so high that, even if the thermal resistance between the first and second members is significantly reduced, the total thermal resistance of the system doesn't change. Thus, in order to control the heat flux (in the case of contact between two protrusions due to a deformation for example), the contact resistances are a very good alternative.

Figure 8:
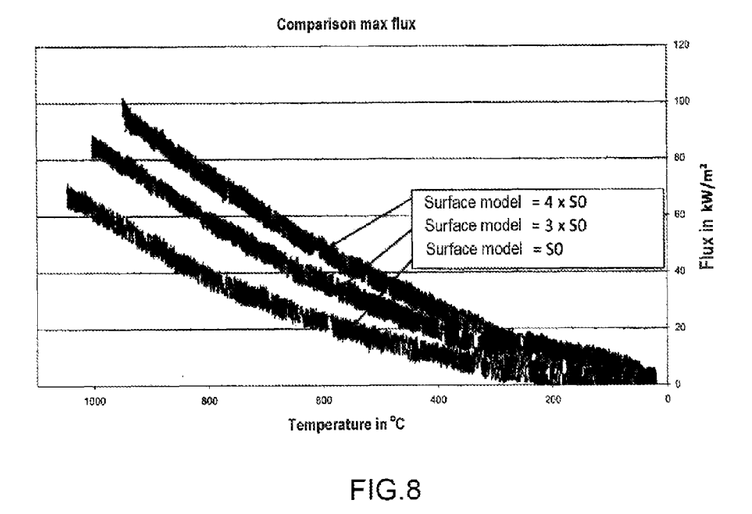
FIG. 8 is a graph illustrating the variations of the maximum heat flux transferred via an exchanger according to the invention and via an exchanger known from the prior art as a function of crucible temperature.

FIG. 8 shows the variation of the maximum heat flux for various exchange surfaces compared with the maximum heat flux that may be extracted by a system having plane opposing surfaces, the area of the opposing surface of such a system being denoted S0.

Figure 9:
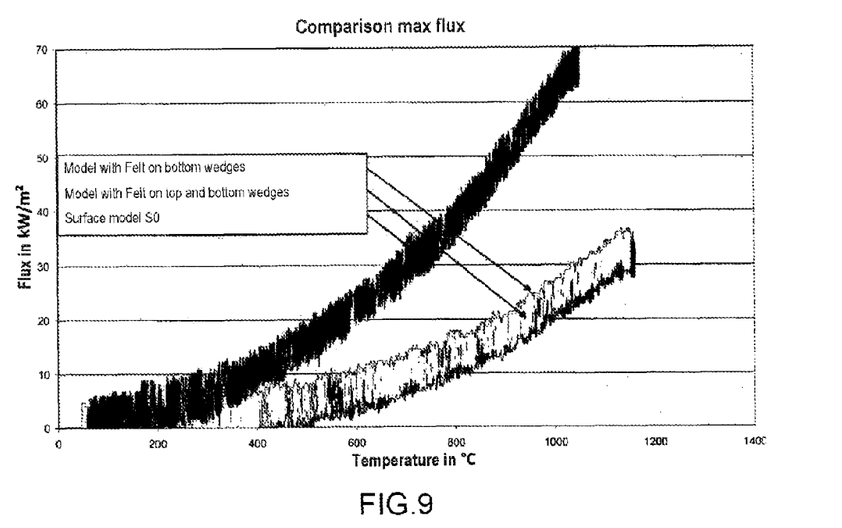
FIG. 9 is a graph illustrating the variations of the minimum heat flux transferred via an exchanger according to the invention and via an exchanger known from the prior art as a function of crucible temperature.

The minimum heat fluxes obtained for these same models are compared in FIG. 9. The model having an area of exchange surface of 4×S0 has the highest maximum heat flux. It only has a single layer of material on the protrusions. Its insulation is slightly inferior than that of the model whose area of exchange surface is 3×S0. This model has a layer of insulating material on each of the protrusions. The area of the opposing exchange surface for these two models when the system is placed in the insulating position is around half of S0, hence resulting in a high thermal resistance. Lastly, the minimum heat flux of the model with a surface area S0 is the same as its maximum heat flux, this exchanger not having a modulatable exchange surface.

Figure 10:
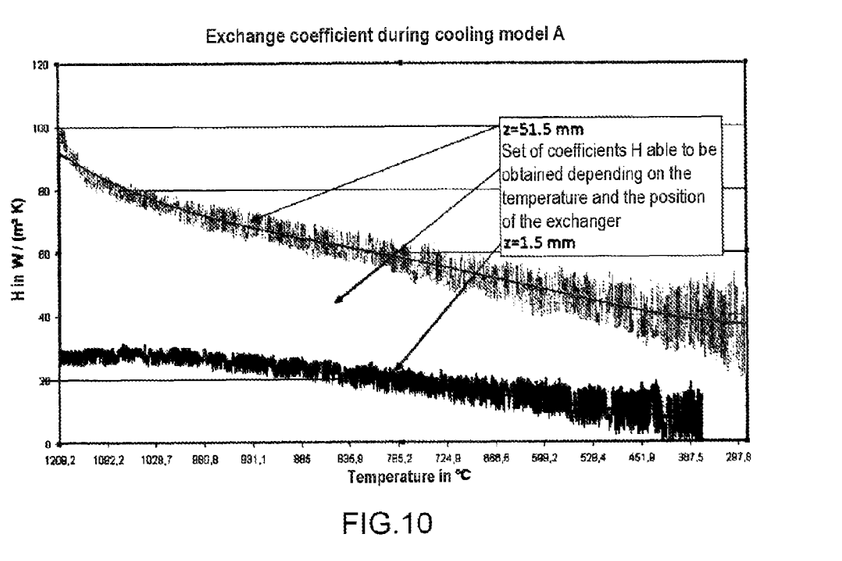
FIG. 10 is a graph illustrating the variations of the amplitude of the exchange coefficient allowed by an exchanger according to the invention as a function of crucible temperature.

FIG. 10 shows the whole range of the exchange coefficients H and hence the range of the heat fluxes that it is possible to obtain with an exchanger according to the invention.

Figure 11:
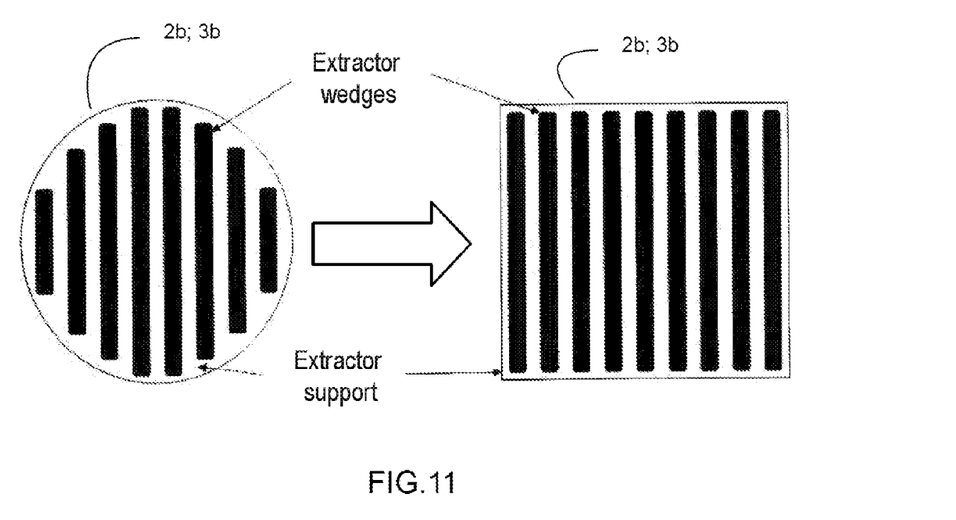
FIG. 11 is a diagram of a third embodiment of an exchanger according to the invention.

In a third embodiment shown in FIG. 11, the first 2b and second 3b members can have circular or square horizontal cross sections. Alternatively, one of the first and second members can have a circular cross section, whereas the other of the first and second members can have a square cross section.

In a fourth embodiment (not shown), the geometry of the pattern of relief is adapted so as to obtain a desired increase in the area of the exchange surface within a given space. For this purpose, in order to increase the areas of the exchange surfaces, the lateral dimensions of the pattern of relief can be minimized and their height increased. The pattern of relief can notably comprise an array of wedges, of bars, of tubes, of cones, of pan-head plates or of pan-head tubes. For a low available height, it is advantageous to reduce the lateral dimension of the pattern of relief and/or to go from rectangular configurations to circular configurations.

A very efficient geometry comprises an array of cylindrical wedges cooperating with circular holes. So as to furthermore conserve the conductance as high as possible, in each of the two members, it is desirable for the area of the cross section of the wedges to be around half of the area of the total cross section of the first member or of the second member S. The maximum factor for increase in the exchange surface area $S_{tot}/S$ is then $1+2H/D$ where D is the diameter of the wedges and H their height.

For a geometry of relief comprising ridges cooperating with grooves, notably parallel ridges cooperating with parallel grooves, this factor is $1+H/d$ where d is the width of the ridges and H their height.

Figure 12:
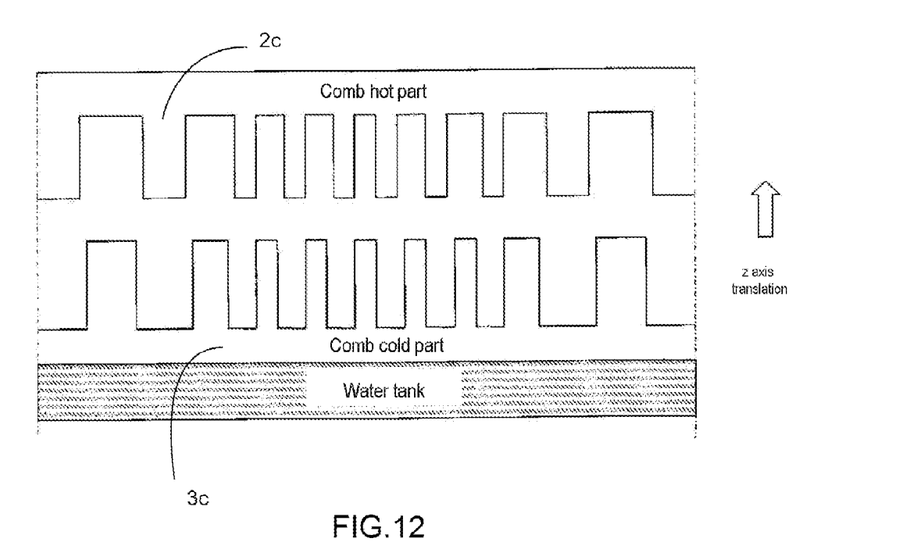
FIG. 12 is a diagram of a fifth embodiment of an exchanger according to the invention.

In a fifth embodiment shown in FIG. 12, the geometry of the pattern of relief is such that it allows a non-uniform distribution of the heat flux to be obtained between the first 2c and second 3c members. Indeed, the protrusions in the centre of the first and second members are thinner than at their periphery. Thus, the density of protrusions is higher in the centre of the members and it is possible to transfer a heat flux from the first member to the second member that is higher at the centre of the members than at their periphery. Preferably, the height of the protrusions is uniform over all of the members or over each of the members.

Figure 13:
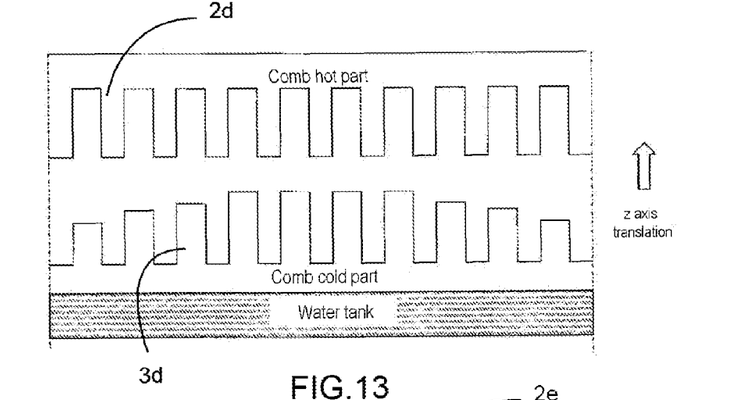
FIG. 13 is a diagram of a sixth embodiment of an exchanger according to the invention.

In a sixth embodiment shown in FIG. 13, the geometry of the pattern of relief is also such that it allows a non-uniform distribution of the heat flux to be obtained between the first 2d and second 3d members. Indeed, the protrusions in the centre of the second member are higher than at their periphery. Alternatively, the protrusions in the centre of the first member are higher than at their periphery. Thus, it is possible to transfer a heat flux from the first member to the second member that is higher at the centre of the members than at their periphery.

Figure 14:
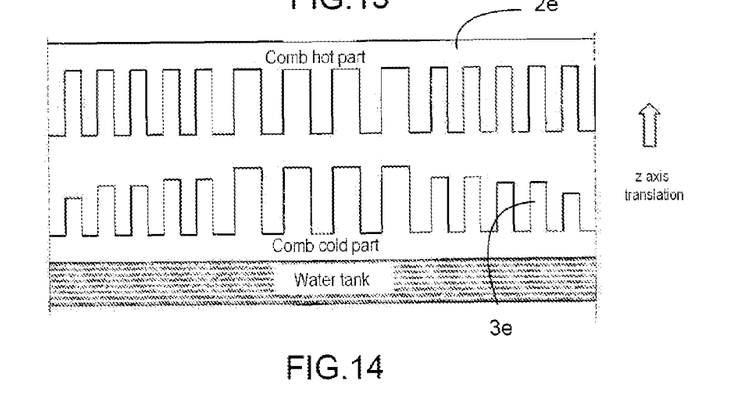
FIG. 14 is a diagram of a seventh embodiment of an exchanger according to the invention.

Preferably, in a seventh embodiment shown in FIG. 14, the fifth and sixth embodiments can be combined. In this embodiment, the protrusions are higher at the centre of the second member 3e and are denser at the periphery of the first 2e and second 3e members. Thus, during solidification, a higher heat flux can be extracted from the crucible in the middle of the first and second members in a first relative position of these members and a uniform heat flux can be extracted from the crucible in a second relative position of the members.

Figure 15:
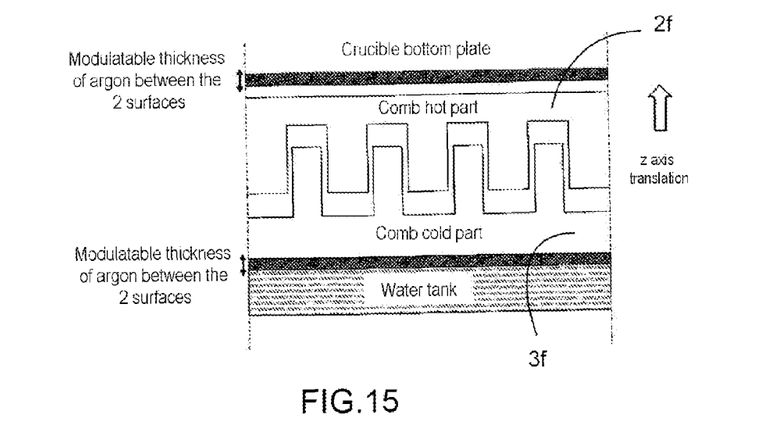
FIG. 15 is a diagram of an eighth embodiment of an exchanger according to the invention.

In an eighth embodiment shown in FIG. 15, between the bottom of the crucible and the first member 2*f* and/or between the cold source and the second member 3*f*, a modulatable thickness of gas can be included, notably a modulatable thickness of argon. This thickness or these thicknesses allow the heat flux transferred from the crucible to the cold source to be limited.

In a ninth embodiment, the heat flux that can be transferred from the first member to the second member is maximized by minimizing the mechanical plays between the first and second members.

Figure 16:
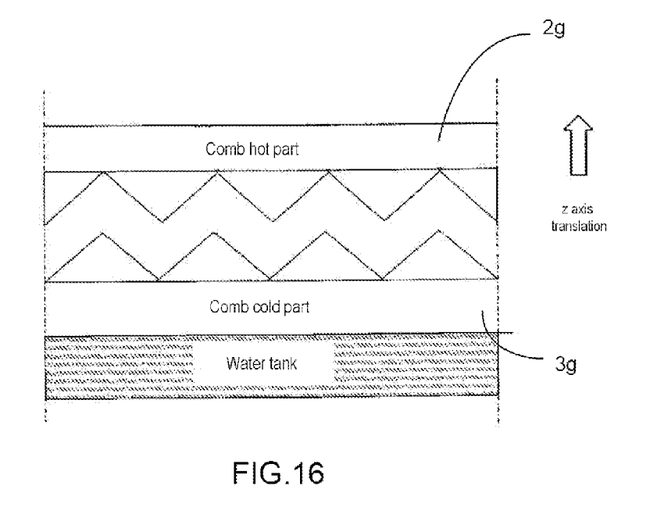
FIG. 16 is a diagram of a ninth embodiment of an exchanger according to the invention.

In one variant of the ninth embodiment, shown in FIG. 16, the heat flux between the first 2*g* and second 3*g* members is maximized by minimizing the mechanical plays while at the same time solving the difficulty of the thermal expansions of the materials. For this purpose, a pattern of relief having circular structures, notably of revolution, is for example chosen. This allows smaller mechanical plays at the periphery of the first and second members while tolerating a mechanical play adapted to the thermal expansions at these locations.

Figure 17:
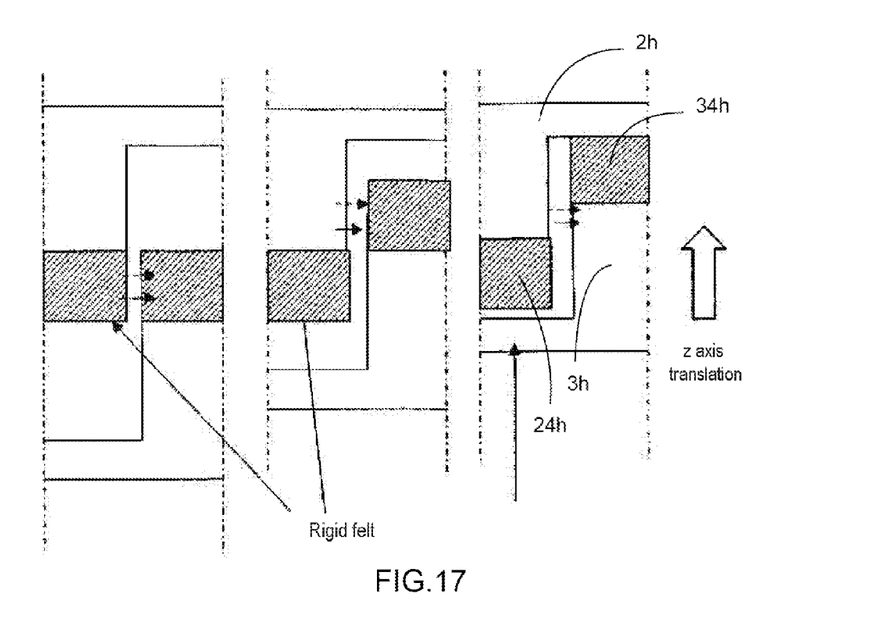
FIG. 17 is a diagram of a tenth embodiment of an exchanger according to the invention.

In a tenth embodiment shown in FIG. 17, the minimum heat flux between the first 2*h* and second 3*h* members is minimized by increasing, with respect to the second embodiment, the thickness of the insulating material 24*h*, 34*h* at the ends of the protrusions.

In an eleventh embodiment (not shown), the minimum heat flux is minimized by forming a chicane between the insulating material elements located at the ends of the protrusions. Thus, the heat flux which could be radiated between the protrusions is blocked. This reduces the transfers by direct radiation in an insulating configuration in the mechanical gap between the first and second members.

Figure 18:
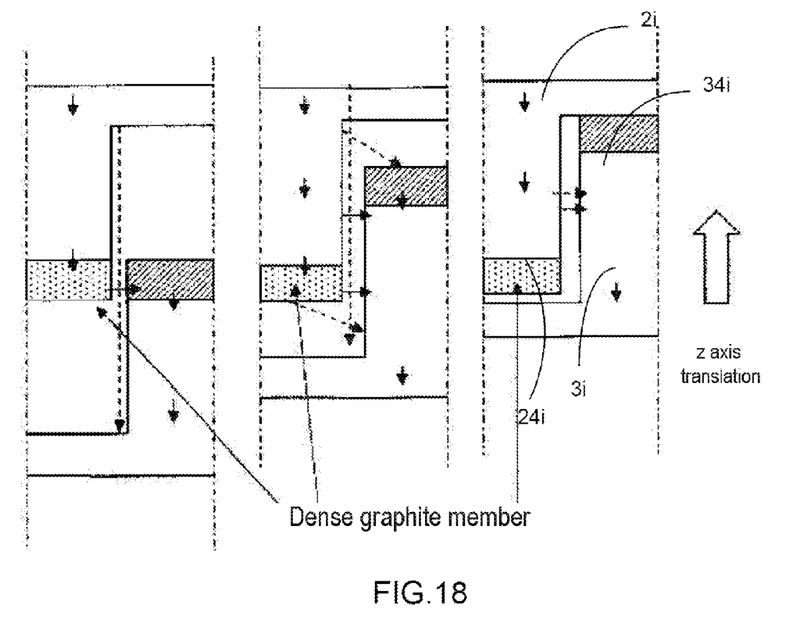
FIG. 18 is a diagram of a twelfth embodiment of an exchanger according to the invention.

In a twelfth embodiment shown in FIG. 18, the maximum heat flux is maximized not using insulating material on the ends of the protrusions of one or the other of the first and second members. A conducting material 24*i* is used on the protrusions of the one of the first and second members. An insulating material 34*i* is used on the protrusions of the other of the first and second members.

Figure 19:
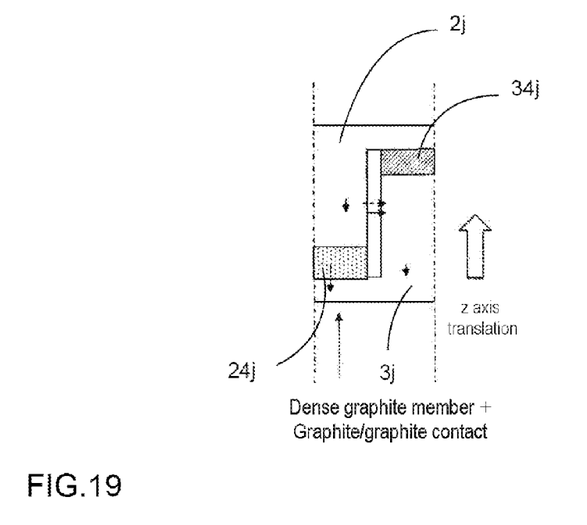
FIG. 19 is a diagram of a thirteenth embodiment of an exchanger according to the invention.

In a thirteenth embodiment shown in FIG. 19, the maximum heat flux is maximized by providing, on the protrusions of the first and/or second members, a possibility for contact between the ends of the protrusions and the bottoms of the recesses between protrusions. The contact may be total or partial. This allows a highly conductive component to be added between the first and second members. The contact can take place via conducting materials 24*j* or insulating materials 34*j* provided at the ends of the protrusions.

Except where there is technical or logical incompatibility, the various embodiments of the exchanger described hereinabove may be combined with one another.

In the various embodiments, the conducting material mainly composing the first and second members may comprise or may be graphite, notably dense graphite.

Similarly, in the various embodiments, the insulating material disposed at the ends of the protrusions can comprise or can be felt.

In the various embodiments of the exchanger according to the invention, the exchanger comprises an element for moving the first member relative to the second member.

The invention also relates to a process for solidification and/or for crystallization of a semiconductor material using an exchanger such as previously described. The process is characterized in that it comprises:
    a step for positioning the first member relative to the second member, and
    a step for heat transfer from the crucible to the cold source, via the first and second members of the exchanger.

For example, the positioning step can be carried out during the heat transfer step. Thus, it is possible to modify the heat flux transferred from the crucible to the cold source during the solidification and/or the crystallization.

Thus, the exchange coefficient of the exchanger can be modified between the beginning and the end of the solidification and/or crystallization. For this purpose, the relative position of the two members can be varied during the solidification and/or the crystallization.

The invention claimed is:

1. A system for solidification or for crystallization of a semiconductor material comprising an exchanger, the exchanger comprising:
    a first member and
    a second member, the first and second members being movable with respect to each other,
    wherein the first member comprises a first pattern of relief and the second member comprises a second pattern of relief, the first pattern of relief being designed to cooperate with the second pattern of relief and in that the exchanger comprises an element for displacement of the first member relative to the second member allowing an exchanged heat flux to be controlled.

2. The system according to claim 1, wherein the displacement element comprises a regulator for modulating the distance between the first member and the second member according to the desired exchanged heat flux.

3. The system according to claim 2, wherein the regulator allows the first and second members to be positioned at least two different distances so as to obtain at least two different exchanged heat fluxes or two different exchange coefficients.

4. The system according to claim 2, wherein the regulator allows the distance between the two members to be continuously varied between a first position where an exchange surface area is a minimum and a second position where the exchange surface area is a maximum.

5. The system according to claim 1, wherein the first pattern of relief comprises recesses and protrusions and in that the second pattern of relief comprises recesses and protrusions.

6. The system according to claim 5, wherein the pitch of the protrusions and of the recesses is variable along one dimension of the first member and of the second member.

7. The system according to claim 5, wherein the height of the protrusions is variable along one dimension of at least one of the first and second members.

8. The system according to claim 1, wherein the first and second patterns of relief cooperate by nesting of protrusions into recesses.

9. The system according to claim 1, wherein the first pattern of relief has protrusions with inclined sides parallel to inclined sides of recesses of the second pattern of relief.

10. The system according to claim 1, wherein the first and second patterns of relief have parallelepipedic structures.

11. The system according to claim 1, wherein the first pattern of relief includes protrusions covered with a first material exhibiting thermal characteristics that are different from the material composing the rest of the first member.

12. The system according to claim 1, wherein the second pattern of relief includes protrusions covered with a second material exhibiting thermal characteristics that are different from the material composing the rest of the second member.

13. The system according to claim 1, wherein the materials of the first and second members have different thermal characteristics.

14. The system according to claim 1, wherein the first member is designed to be thermally linked to a crucible or to a mould and in that the second member is designed to be thermally linked to a cold source.

15. The system according to claim 14, wherein the system comprises a first element for including a modulatable thickness of gas between the crucible and the first member or in that the system comprises a second element for including a modulatable thickness of gas between the cold source and the second member.

16. The system according to claim 14, wherein the first or of the second member includes at least one protrusion that is dimensioned to come into contact in a bottom of a recess of the second or of the first members in a particular relative position of the first and second members.

17. Process for solidification or for crystallization of a semiconductor material using the system according to claim 1, wherein the method comprises:
    a step for positioning the first member relative to the second member, and
    a step for heat transfer from a crucible to a cold source, via the first and second members of the exchanger.

18. Process according to claim 17, wherein the positioning step is carried out during the heat transfer step to modify heat flux transferred from the crucible to the cold source during solidification and/or crystallization the semiconductor material.

19. Process according to claim 17, wherein a heat exchange coefficient of the exchanger is varied between the beginning and the end of the solidification or crystallization.

20. A heat exchanger, notably heat exchanger for a solidification or crystallization system for a semiconductor material, comprising
    a first member and
    a second member, the first and second members being movable with respect to each other,
    wherein the first member comprises a first pattern of relief and the second member comprises a second pattern of relief, the first pattern of relief being designed to cooperate with the second pattern of relief and in that the exchanger comprises an element for displacement of the first member relative to the second member allowing an exchanged heat flux to be controlled,
    wherein the displacement element comprises a regulator for modulating the distance between the first member and the second member according to the desired exchanged heat flux,
    wherein the regulator allows the distance between the two members to be continuously varied between a first position where an exchange surface area is a minimum and a second position where the exchange surface area is a maximum.

21. A heat exchanger, notably heat exchanger for a solidification or crystallization system for a semiconductor material, comprising
    a first member and
    a second member, the first and second members being movable with respect to each other,
    wherein the first member comprises a first pattern of relief and the second member comprises a second pattern of relief, the first pattern of relief being designed to cooperate with the second pattern of relief and in that the exchanger comprises an element for displacement of the first member relative to the second member allowing an exchanged heat flux to be controlled,
    wherein the first pattern of relief comprises recesses and protrusions and in that the second pattern of relief comprises recesses and protrusions,
    wherein the pitch of the protrusions and of the recesses is variable along one dimension of the first member and of the second member.

* * * * *